United States Patent [19]

Badesha et al.

[11] Patent Number: 4,839,451

[45] Date of Patent: Jun. 13, 1989

[54] PROCESSES FOR THE PREPARATION OF POLYSILYLENES

[75] Inventors: Santokh S. Badesha, Pittsford; Milan Stolka, Fairport; Kathleen M. McGrane, Rochester; Ronald J. Weagley, Penfield, all of N.Y.

[73] Assignee: Xerox Corporation, Stamford, Conn.

[21] Appl. No.: 177,213

[22] Filed: Apr. 4, 1988

[51] Int. Cl.$^4$ ............................................. C08G 77/00
[52] U.S. Cl. ..................................... 528/10; 556/430
[58] Field of Search ........................... 528/10; 556/430

[56] References Cited

U.S. PATENT DOCUMENTS

| | | | |
|---|---|---|---|
| 2,554,976 | 5/1951 | Burkhard | 260/448.2 |
| 2,606,879 | 8/1952 | Clark | 260/2 |
| 2,886,582 | 5/1959 | Kautsky et al. | 260/448.2 |
| 4,260,780 | 4/1981 | West | 556/430 |
| 4,324,901 | 4/1982 | West et al. | 556/430 |
| 4,587,205 | 5/1986 | Harrah et al. | 430/326 |
| 4,618,551 | 10/1986 | Stolka et al. | 430/58 |

FOREIGN PATENT DOCUMENTS

| | | |
|---|---|---|
| 666359 | 2/1952 | United Kingdom . |
| 671773 | 5/1952 | United Kingdom . |
| 671774 | 5/1952 | United Kingdom . |

Primary Examiner—Melvyn I. Marquis
Attorney, Agent, or Firm—E. O. Palazzo

[57] ABSTRACT

A process for the preparation of high weight average molecular weight polysilylenes which comprises (1) simultaneously adding an alkali metal and a dihalodisubstituted silane monomer to a solvent; (2) heating the aforementioned mixture, followed by cooling; and (3) subsequently separating the product therefrom.

16 Claims, 1 Drawing Sheet

PROCESSES FOR THE PREPARATION OF POLYSILYLENES

BACKGROUND OF THE INVENTION

This invention is directed generally to processes for the preparation of polysilylenes, and more specifically to processes for the preparation of polysilylene polymers by the simultaneous addition of an alkali metal, and a dihalodisubstituted silane monomer, including dihalodialkyl and dihalodiaryl silane monomers, to a suitable solvent. In one embodiment the present invention is directed to a simple economical process for the preparation of polysilylenes, by the simultaneous addition of a silane monomer and a sodium dispersion to an organic solvent, and thereafter separating the desired product. The aforementioned polysilylene products are useful for incorporation into imaging members comprised of for example, a supporting substrate, a photogenerating layer, and in contact therewith as a charge or hole transport layer the polysilylenes, especially poly(methylphenyl silylene), poly(n-propyl methyl silylene), and other similar silylenes. Additionally, the layer with the polysilylene hole transporting compound can be located as the top layer of the imaging member, or alternatively it may be situated between the supporting substrate and the photogenerating layer. The aforementioned imaging members are particularly useful in electrophotographic, and especially xerographic, imaging processes including those wherein there are selected for development liquid ink compositions.

Imaging members comprised of polysilylenes are illustrated in U.S. Pat. No. 4,618,551, the disclosure of which is totally incorporated herein by reference. More specifically, there is illustrated in this patent a polysilylene hole transporting compound for use in layered imaging members comprised of the formula as recited in claim 1, for example. More specifically, there is described in the aforementioned patent an improved layered photoresponsive imaging member comprised of a supporting substrate, a photogenerating layer, and as a hole transport layer in contact therewith a polysilylene compound of the formula

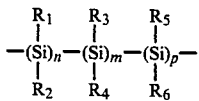

wherein $R_1$, $R_2$, $R_3$, $R_4$, $R_5$, and $R_6$ are independently selected from the group consisting of alkyl, aryl, substituted alkyl, substituted aryl, and alkoxy; and m, n, and p are numbers that reflect the percentage of the particular monomer unit in the total polymer compound. Preferred polysilylene hole transporting compounds illustrated in this patent include poly(methylphenyl silylenes), which silylenes more preferably have a weight average molecule weight of in excess of 50,000, and preferably are of a weight average molecule weight of about 75,000 to about 1,000,000. The aforementioned polysilylenes can be prepared by known methods, reference the Journal of Organometallic Chemistry, page 198, C27, (1980), R. E. Trujillo. Also, other polysilylenes can be prepared as described in the Journal of Polymer Science, Polymer Chemistry Edition, Vol. 22, pages 225 to 238, (1984), John Wiley and Sons, Inc.. More specifically, the aforementioned polysilylenes can be prepared as disclosed in this article by the condensation of a dichloromethyl phenyl silane with an alkali metal such as sodium. In one preparation sequence, there is reacted a dichloromethyl phenyl silane in an amount of from about 0.1 mole with sodium metal in the presence of 200 milliliters of solvent, and wherein the reaction is accomplished at a temperature of from about 100° C. to about 140° C. There results, as identified by elemental analysis, infrared spectroscopy, UV spectroscopy, and nuclear magnetic resonance, the polysilylene products subsequent to the separation thereof from the reaction mixture. The aforementioned prior art, however, does not disclose the simultaneous addition of an alkali metal and a dihalodialkyl silane monomer.

There is disclosed in U.S. Pat. No. 2,554,976, and British Pat. No. 666,359 the preparation of low molecular weight polymethylsilylenes by the admixing of dimethyldihalogenosilane and sodium, followed by the addition of an inert diluent, such as toluene, and thereafter heating the aforementioned mixture, reference column 1, line 36 to column 2, line 11, for example. Thus, in this process there is no disclosure as to the simultaneous addition of monomer and alkali to a solvent. Accordingly, there results polysilylenes of low molecular weight, for example 2,000 to 3,200, which polysilylenes are not believed to be useful as hole transport molecules in photoconductive imaging members as illustrated in detail hereinafter.

Other patents disclosing similar processes include British 671,773, and 671,774; and U.S. Pat. Nos. 2,606,879 and 4,260,780. Also of background interest are U.S. Pat. Nos. 2,886,582; 4,587,780; 4,588,801 and 4,587,205.

When selecting components for photoreceptors, particularly photogenerating or hole transport substances, it is important that when the member is exposed to light that it retain its stability; and more specifically, that the components thereof are not adversely effected by light causing them to degrade or decompose and thereby rendering them substantially useless for their intended purposes. In addition, during the corona charging step in electrostatic imaging processes, the voltages emitted may cause degradation of the components in the imaging member affecting the undesirable degradation thereof, and permitting emission of products, and in some instances, hazardous products to the environment.

Advantages of the process of the present invention include desirable solvent inertness, and further the polymeric product formed has advantages associated with polymers including excellent mechanical ressitance. Accordingly, there is a need for processes that will permit the preparation of polysilylenes to enable their incorporation into photoconductive imaging members and permitting the resulting members to be useful for extended time periods exceeding, for example, 1,000,000 imaging cycles without degradation. There is also a need for processes wherein the reactions are not exothermic, and wherein there can be obtained high molecular weight polymers, which have low polydispersability and are substantially free of low molecular weight fractions, that is those below a weight average of, for example, 10,000 to 50,000. Additionally, the imaging members within which these polymer products are selected are substantially free of environmental problems.

SUMMARY OF THE INVENTION

It is an object of the present invention to provide processes for the preparation of polysilylenes.

It is another object of the present invention to provide simple, economical processes for the preparation of polysilylenes useful as charge or hole transporting substances in layered photoresponsive imaging members.

Another object of the present invention resides in the provision of a nonhazardous process since the exotherm of the reaction can be controlled by the rate of addition of the reactants.

Furthermore, in another object of the present invention there are provided processes that enable the preparation of polysilylenes which are monomodal.

Moreover, in a further object of the present invention there are provided processes for the preparation of polysilylenes that are free of degradation upon exposure to light, and do not emit undesirable byproducts subsequent to being subjected to corona charging processes in electrophotographic imaging apparatuses.

In addition, another object of the present invention resides in the preparation of polysilylenes by the addition of silylene monomer, and alkali metal to a suitable solvent thereby enabling polysilylenes with a weight average molecular weight of from about 100,000 to 2,000,000.

Additionally, in another object of the present invnetion there are provided processes for the preparation of polysilylenes by the simultaneous addition of silylene monomer, and alkali metal to a suitable solvent thereby enabling polysilylenes with a weight average molecular weight of from about 100,000 to 2,000,000 which processes are not exothermic.

In yet another object of the present invention there are provided layer imaging members comprised of a photogenerating pigment and a hole transporting polysilylene prepared by the process illustrated herein.

Another object of the present invention resides in imaging members with hole transporting polysilylenes with improved electrical stability, and wherein the electronic transport properties thereof are substantially enhanced, which polysilylenes are obtained by the process illustrated herein.

These and other objects of the present invention are accomplished by the provision of processes for the preparation of polysilylenes. More specifically, there are provided in accordance with the present invention processes for the preparation of polysilylenes of the formula

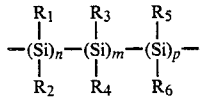

wherein $R_1$, $R_2$, $R_3$, $R_4$, $R_5$, and $R_6$ are independently selected from the group consisting of alkyl, aryl, substituted alkyl, substituted aryl, and alkoxy; and m, n, and p are numbers that reflect the percentage of the particular monomer unit in the total polymer composition with the sum of n plus m plus p being equal to 100 percent. Specifically thus, for example, zero percent is less than, or equal to n, and n is less than or equal to 100 percent; and zero percent is less than, or equal to m, and m is less than, or equal to 100 percent; and zero is less than, or equal to p, and p is less than, or equal to 100 percent.

Any of the monomer units of the polysilene can be randomly distributed throughout the polymer, or may alternatively be in blocks of varying lengths. The process comprises the simultaneous addition of an alkali metal, preferably sodium, or alkali metal dispersion and a dihalodialkyl silane monomer, wherein halo can be chloride, fluoride, bromide, or iodide, and alkyl is from about 1 to about 25 carbon atoms such as methyl, ethyl, heptyl, butyl, propyl, hexyl, octyl, pentyl, and the like; or other dihalodisubstituted dihaloarylalkyl silanes, wherein aryl is from 6 to about 24 carbon atoms, such as phenyl, tolyl, or xylyl, to a suitable solvent; heating the aforementioned mixture; cooling the products formed; and subsequently separating the resulting polysilylene product therefrom. Examples of the silane reactant include dichlorophenyl methyl silane, dimethyl dichloro silane, diethyl dichloro silane, diphenyl dichloro silane, phenyl ethyl dichloro silane, tolyl methyl dichloro silane, cyclohexyl methyl dichloro silane, phenethyl methyl dichloro silane, cyclohexyl ethyl dichloro silane, dichlorocyclohexylmethyl silane, and propyl methyl dichloro silane.

More specifically, thus in contrast to the above prior art, with the process of the present invention the inert solvent selected is first introduced into a reaction vessel such as a flask which is equipped with funnels, mechanical stirring rod, and an inert gas inlet. Thereafter, a dihalodialkyl monomer silane is added to the metal flask through one of the aforementioned drop funnels, and an alkali metal, such as a sodium dispersion, is pumped with the assistance of a syringe or a dispersion pump through the second aforementioned dropping funnel. Thus, the monomer and sodium dispersion are added simultaneously to the stirring solvent. The amount of reactants selected is dependent on a number of variables, including the specific solvent utilized; however, in one embodiment of the present invention about 1 mole of the monomer to 2 moles of the sodium dispersion are selected. Also, in a preferred embodiment, for about every 10 grams of monomer there is selected about 100 milliliters of solvent or mixtures of solvents. Additionally, the alkali metal, such as sodium, can be dispersed in various substances inclusive of toluene, mineral spirits, light oils, waxes, and the like with the light oils being preferred; and wherein from about between 10 percent to about 50 percent by weight of sodium is usually selected. Subsequent to the addition of all reactants, the reaction container is heated to a temperature of, for example, from about 50° C. to about 120° C. for an extended time period, for example from about 2 to about 4 hours, followed by cooling this mixture to room temperature, and filtering the product therefrom. The resulting product is then discarded, adn the filtrate is poured slowly in a dropwise manner into a material such as hexane yielding a white precipitate, which precipitate after filtration is collected and washed repeatedly with a solvent such as hexane enabling the final product, which was identified, for example, by GPC analysis. The weight average molecule weight of the resulting desired polysilylene product is from about 100,000, and preferably 200,000, to about 2,000,000.

With further respect to the aforementioned polysilylenes obtained by the process of the present invention, examples of alkyl groups include those that are linear, or branched of from 1 carbon atom to about 24 carbon atoms, and preferably from about 1 carbon atom to about 8 carbon atoms, inclusive of methyl, ethyl, propyl, butyl, amyl, hexyl, octyl, nonyl, decyl, pentadecyl, stearyl; and unsaturated alkyls inclusive of alyls, and other similar substituents. Specific preferred alkyl groups are methyl, ethyl, propyl, and butyl. Aryl substituents include those of from 6 carbon atoms to about 24 carbon atoms, inclusive of phenyl, naphthyl, anthryl, and the like. These alkyl and aryl groups may be substituted with alkyl, aryl, halogen, nitro, amino, alkoxy, cyano, and other related substituents. Examples of alkoxy groups includes those with from 1 carbon atom to about 10 carbon atoms, such as methoxy, ethyoxy, propoxy, butoxy, and other similar substituents.

Illustrative specific examples of polysilylene hole transporting compounds formulated in accordance with the process of the present invention include poly(methylphenyl silylene), poly(methylphenyl) silylene-co-dimethyl silylene), poly(cyclohexylmethyl silylene), poly(tertiarybutylmethyl silylene), poly(phenylethyl silylene), poly(n-propylmethyl silylene), poly(p-tolylmethyl silylene), poly(cyclotrimethylene silylene), poly(cyclotetramethylene silylene), poly(cyclopentamethylene silylene), poly(di-ti-butyl silylene-co-dimethyl silylene), poly(diphenyl silylene-co-phenylmethyl silylene), poly(cyanoethylmethyl silylene), which polysilylenes generally have a weight average molecular weight of from about 100,000 to about 2,000,000.

The resulting polysilylenes are particularly useful as hole or charge transporting components in layered photoresponsive imaging members as illustrated in U.S. Pat. No. 4,618,551, the disclosure of which has been previously totally incorporated herein by reference. Thus, in one specific embodiment of the present invention there is provided an improved photoresponsive imaging member comprised of a supporting substrate, a photogenerating layer comprised of inorganic or organic photoconductive pigments optionally dispersed in an inactive resinous binder, and as a top layer functioning as a transporting component the aforementioned polysilylenes. Another specific photoresponsive imaging member of the present invention is comprised of the polysilylene hole transporting component layer situated between the supporting substrate and the photogenerating layer.

The aforementioned photoresponsive imaging members of the present invention can be prepared by a number of known methods, the process parameters, and the order of the coating of the layers being dependent on the member desired. Thus, for example, the improved photoresponsive members can be prepared by providing a conductive substrate with an optional hole blocking layer, and optional adhesive layer; and applying thereto by solvent coating processes, laminating processes, or other methods, a photogenerating layer and the polysilylene hole transport layer. Other methods include melt extrusion, dip coating, and spraying.

BRIEF DESCRIPTION OF THE DRAWINGS

For a better understanding of the present invention and further features thereof, reference is made to the following detailed description of various embodiments wherein.

As overcoatings for these members, there can be selected polymers, and other similar materials, including an aryl amine dispersed in a resin binder, inclusive of polycarbonates containing carbon black. The carbon black is usually present in various amounts, however, from about 5 percent to about 15 percent of carbon black is preferred.

DESCRIPTION OF THE PREFERRED EMBODIMENTS

Figure 1:
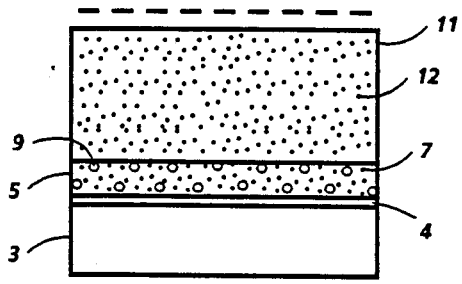
FIG. 1 is a partially schematic cross-sectional view of a photoresponsive imaging member with the polysilylenes prepared by the process of the present invention.

Illustrated in FIG. 1 is a negatively charged photoresponsive imaging member, and comprising a supporting substrate 3, an optional adhesive blocking layer 4, a charge carrier photogenerating layer 5 comprised of a photogenerating pigment 7, optionally dispersed in inactive resinous binder composition 9, and hole transport layer 11 comprised of 12, a polysilylene hole transporting compound obtained by the process illustrated herein. In an alternative embodiment of the present invention, and with further regard to FIG. 1, the hole transporting layer can be situated between the supporting substrate and the photogenerating layer resulting in a positively charge imaging member.

Figure 2:
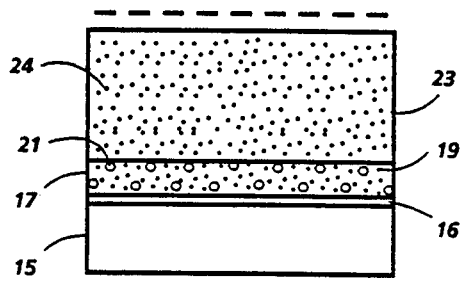
FIG. 2 is a partially schematic cross-sectional view of a photoresponsive imaging member with a specific polysilylene prepared by the process of the present invention.

Illustrated in FIG. 2 is a negatively charged photoresponsive imaging member comprised of a conductive supporting substrate 15 of aluminized Mylar, an optional adhesive blocking layer 16, a photogenerating layer 17 comprised of a trigonal selenium photogenerating pigment 19; or other similar inorganic pigments as well as organic pigments dispersed in a resinous binder 21, and a hole transport layer 23 comprised of a poly(methylphenyl silylene) 24 obtained by the process of Example I.

With further respect to the imaging members, the supporting substrate layers may be opaque or substantially transparent, and may comprise any suitable material having the requisite mechanical properties. Thus, these substrates may comprise a layer of nonconducting material such as an inorganic or organic polymeric material, a layer of an organic or inorganic material having a conductive surface layer arranged thereon or a conductive material such as, for example, aluminum, chromium, nickel, indium, tin oxide, brass or the like. The substrate may be flexible or rigid and may have any of many different configurations such as, for example, a plate, a cylindrical drum, a scroll, an endless flexible belt and the like. Preferably, the substrate is in the form of an endless flexible belt. The thickness of the substrate layer depends on many factors including economical considerations. Thus, this layer may be of substantial thickness, for example, over 100 mils or minimum thickness providing there are no adverse effects on the system. In one preferred embodiment, the thickness of this layer ranges from about 3 mils to about 10 mils.

Examples of pigments for the photogenerating layer are as illustrated, for example, in U.S. Pat. No. 4,618,551, the disclosure of which is totally incorporated herein by reference, inclusive of amorphous selenium, selenium alloys such as $As_2Se_3$, trigonal selenium, metal free phthalocyanines, metal phthalocyanines, vanadyl phthalocyanines, squaraines, and the like, with $As_2Se_3$ being preferred. Typically, this layer is of a thickness of from about 0.3 micron to about 10 microns or more; however, dependent on the photoconductive volume loading which may vary from 5 to 100 volume percent, this layer can be of other thicknesses, such as from about 0.5 to about 3 microns. Generally, it is desirable to provide this layer in a thickness which is sufficient to absorb about 90 percent or more of the incident radiation, which is directed upon it in the imagewise exposure step. The maximum thickness of this layer is dependent primarily upon facts such as mechanical considerations, for example, whether a flexible photoresponsive imaging member is desired. Optional resin binders selected for the photogenerating pigments or in some instances for the hole transport layer include, for example, the polymers as illustrated in U.S. Pat. No. 3,121,006, the disclosure of which is totally incorporated herein by reference; polyesters, polyvinyl butyrals, polyvinyl carbazoles, polycarbonate resins, epoxy resins, polyhydroxyether resins, and the like.

Also, the polysilylenes obtained by the process of the present invention are also useful as protective overcoating materials for various photoreceptor members including amorphous selenium, selenium alloys, hydrogenated amorphous silicon, layered members containing selenium arsenic alloys as the top layer, reference U.S. Ser. No. 487,935 entitled Overcoated Photoresponsive Devices, the disclosure of which is totally incorporated herein by reference; and layered imaging members comprised of a photogenerating layer, and a diamine hole transport layer, reference U.S. Pat. No. 4,265,990 referred to hereinbefore. In this embodiment, the polysilylenes are applied as an overcoating to the imaging member in a thickness of from about 0.5 micron to about 7.0 microns, and preferably from about 1.0 micron to about 4.0 microns. Moreover, the polysilylene compositions of the present invention can be selected as resinous binders for the imaging members described herein, including binders for inorganic and organic photogenerators such as trigonal selenium, selenium alloys, hydrogenated amorphous silicon, silicon-germanium alloys, and vanadyl phthalocyanine. In this embodiment, for example, the imaging member is comprised of a supporting substrate, a photogenerating layer comprised of a photogenerating pigment of trigonal selenium, or vanadyl phthalocyanine dispersed in the polysilylene compositions, which are now functioning as a resinous binder; and as a top layer an aryl amine hole transport composition, reference the '990 patent mentioned herein, or polysilylenes.

Further, the polysilylenes of the present invention may also function as interface layers. As interface layers the polysilylenes are applied between, for example, a supporting substrate and the photogenerating layer, or the photogenerating layer and the hole transport layer, enabling improved attachment of the respective layers. Also, there can be included in the imaging members illustrated herein adhesive layers such as polyester resins available as Ditel PH-100, Ditel PH-200, and Ditel PH-222, all available from Goodyear Tire and Rubber Company; polyvinyl butyral; DuPont 49,000 polyester; and the like. The aforementioned adhesive layer is generally of a thickness of from about 200 micrometers to about 900 micrometers, and is applied from a solvent solution of, for example, tetrahydrofuran toluene and methylene chloride. This adhesive layer can be situated on the supporting substrate or may be situated between an optional hole blocking layer and the supporting substrate. Examples of blocking layers include siloxanes as illustrated in U.S. Pat. No. 4,464,450, the disclosure of which is totally incorporated herein by reference. Other blocking layers include the silylenes as illustrated in U.S. Pat. Nos. 4,338,387; 4,286,033; and 4,291,110, the disclosures of which are totally incorporation herein by reference, including (gamma - amino propyl) methyl diethoxyl silylenes.

The imaging members of the present invention are useful in various electrophotographic imaging systems, especially xerographic systems, wherein an electrostatic image is formed on the photoresponsive imaging member, followed by the development thereof, transfer to a suitable substrate, and fixing of the resultant image. Development can be accomplished with known liquid or dry developer compositions, especially positively charged developer compositions, reference U.S. Pat. No. 4,560,635, the disclosure of which is totally incorporated herein by reference.

With further respect to the aforementioned imaging processes, the polysilylenes do not degrade upon exposure to imaging light, nor are undesirable byproducts emitted subsequent to corona charging in a xerographic imaging process thereby preventing the electrical properties and mechanical characteristics of the resulting imaging member to remain stable for an extended number of imaging cycles exceeding 1,000,000, for example.

The invention will now be described in detail with respect to specific preferred embodiments thereof, it being understood that these examples are intended to be illustrative only. The invention is not intended to be limited to the materials, conditions, process parameters, etc. recited herein. All parts and percentages are by weight unless otherwise indicated.

EXAMPLE I

Preparation of Poly(methyl phenyl silylene) Product

A 250 milliliter four-necked round bottom flask was fitted with a water cooled condenser, high speed overhead stirrer, and two 50 milliliter pressure equalized addition funnels. In the flask was placed 100 milliliters of toluene (previously dried over sodium metal). There was placed in one addition funnel 19.1 grams, 0.1 mole, dichlorophenyl methyl silane, and 11.5 milliliters (0.2 mole) of a sodium dispersion in light oil (40 percent by weight sodium content) was added to the second addition funnel. Thereafter, the toluene in the reaction flask was then stirred vigorously under argon atmosphere, and the monomer and sodium dispersion was added simultaneously to the stirring toluene over a 20 minute period. The reaction was exothermic, and the color of the reaction mixture was dark blue. Subsequently, the contents of the flask were then heated and stirred by placing the flask in an oil bath maintained at 130° C., which stirring and heating was continued for three hours after which time the resulting dark blue slurry was filtered while hot. The precipitate was discarded and the clear filtrate, which is a solution of the poly(methylphenyl silylene) was then added dropwise to 700 milliliters of methanol. Thereafter, the white fluffy precipitate collected by filtration was then redissolved in 100 milliliters of toluene, the resulting toluene solution was filtered to remove suspended particles, and the clear solution was then added to 500 milliliters of hexane. The above white precipitate product polysilylene was collected and dried, and an overall yield of 2.8 grams, 23 percent was obtained. GPC analysis indicated the molecular weight (weight average) to be 920,000, and no low molecular weight fractions of less than 10,000 for the product. Also, UV, IV, NMR and elemental analysis confirmed that the polymer was poly(methyl phenyl silane).

EXAMPLE II

Preparation of Poly(methyl phenyl silylene)

The process of Example I was repeated with the exception that 40 percent by weight sodium dispersion in mineral oil was selected. Yield was 21 percent, and addition time of the monomer and the dispersion was 23 minutes.

EXAMPLE III

Preparation of Poly(cyclohexyl methyl silylene) Product

This polymer was prepared by the method described in Example I, wherein the monomer was dichlorocyclo hexylmethyl silane (0.1 mole) and (0.2 mole) of sodium dispersion (40 percent by weight sodium content in light oil) was added simultaneously over a period of 10 minutes. The polymer product, which is poly(cyclohexyl methyl silylene) was collected as white fluffy powder and GPC analysis indicated the molecular weight to be 850,000. The structure of the product was also confirmed by UV, IR, elemental analysis and NMR.

EXAMPLE IV

A photoresponsive imaging member was then prepared by providing an aluminized Mylar substrate in a thickness of three mils, followed by applying thereto with a multiple clearance film applicator in a wet thickness of 0.5 micron, a layer of 3-aminopropyl triethoxy silane, available from PCR Research Chemicals of Florida, and ethanol in a 1:50 volume ratio. This layer was then allowed to dry for 5 minutes at room temperature, followed by curing for 10 minutes at 110° C. in a forced air oven. A photogenerating layer of amorphous selenium in a thickness of 0.4 micron was then applied by vacuum evaporation to the silane layer.

Thereafter, the amorphous selenium photogenerating layer was overcoated with the poly(methylphenyl silylene) transport layer of Example I from a solution of toluene and tetrahydrofuran, volume ratio of 2:1, this deposition being affected by spraying. There resulted after drying a charge transport layer of 20 microns in thickness.

Electrostatic latent images can be generated on the above-prepared imaging member by incorporation thereof into a xerographic imaging test fixture, and after charging the member to a negative voltage of about 1,000 volts. Thereafter, the resulting images can be developed with a toner composition comprised of 90 percent by weight of a styrene n-butylmethacrylate copolymer (58/42), 8 percent by weight of carbon black particles, and 2 percent by weight of the charge enhancing additive cetyl pyridinium chloride. The aforementioned imaging member would be useful for in excess of 500,000 imaging cycles, and wherein no cracking of the members should occur because of the presence of the poly(methylphenyl silylene) hole transporting component.

Although the invention has been described with reference to specific preferred embodiments, it is not intended to be limited thereto; rather, those skilled in the art will recognize variations, and modifications may be made therein which are within the spirit of the invention and within the scope of the following claims.

What is claimed is:

1. A process for the preparation of high weight average molecular weight polysilylenes which comprises (1) simultaneously adding an alkali metal and a monomer selected from the group consisting of dihalodialkyl silane monomers, dihalodiaryl silane monomers, and dihaloarylalkyl silane monomers to an inert solvent; (2) heating the aforementioned mixture, followed by cooling; and (3) subsequently separating the product therefrom.

2. A process for the preparation of high weight average molecular weight polysilylenes with a weight average molecular weight of from about 100,000 to about 2,000,000 which comprises (1) simultaneously adding an alkali metal or a dispersion of an alkali metal in an organic solvent and a monomer seelcted from the group consisting of dihalodialkyl silane monomers, dihalodiaryl silane monomers, and dihaloarylalkyl silane monomers to an organic solvent; (2) heating the aforementioned mixture to a temperature of from about 50° to about 120° C., followed by cooling; and (3) subsequently separating the product therefrom.

3. A process in accordance with claim 2 wherein the dihalo silane monomer is selected from the group consisting of dichlorophenyl methyl silane, dimethyl dichloro silane, diethyl dichloro silane, diphenyl dichloro silane, phenyl ethyl dichloro silane, tolyl methyl dichloro silane, cyclohexyl methyl dichloro silane, phenethyl methyl dichloro silane, cyclohexyl ethyl dichloro silane, dichlorocyclohexylmethyl silane, and propyl methyl dichloro silane.

4. A process in accordance with claim 2 wherein the alkali metal is sodium, or potassium.

5. A process in accordance with claim 2 wherein the dispersion contains a mineral oil.

6. A process in accordance with claim 2 wherein the solvent is selected from the group consisting of toluene, benzene, xylene, and mixtures thereof.

7. A process in accordance with claim 2 wherein the silane monomer is present in an amount of about 1 mole and the alkali metal is sodium and is present in an amount of about 2 moles.

8. A process in accordance with claim 2 wherein the polysilylene is of the formula

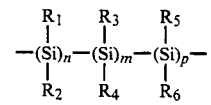

wherein $R_1$, $R_2$, $R_3$, $R_4$, $R_5$, $R_6$ are independently selected from the group consisting of alkyl, aryl, substituted alkyl, substituted aryl, and alkoxy; and m, n, and p are numbers that reflect the percentage of the monomer unit in the total polymer compound.

9. A process in accordance with claim 2 wherein the polysilylene is poly(methylphenyl silylene).

10. A process in accordance with claim 2 wherein the polysilylene is poly(n-propylmethyl silylene).

11. A process in accordance with claim 1 wherein there is obtained monomodal high molecular weight polysilylene.

12. A process in accordance with claim 1 wherein the weight average molecular weight of the polysilylene is from about 100,000 to about 2,000,000.

13. A process in accordance with claim 1 wherein the silane is a dihalodialkyl monomer.

14. A process in accordance with claim 1 wherein the silane is a dihaloarylalkyl silane.

15. A process in accordance with claim 13 wherein alkyl contains from 1 to about 25 carbon atoms.

16. A process in accordance with claim 14 wherein aryl contains from 6 to about 24 carbon atoms.

* * * * *